United States Patent
Tsai et al.

(10) Patent No.: US 7,057,564 B2
(45) Date of Patent: Jun. 6, 2006

(54) MULTILAYER CAVITY SLOT ANTENNA

(75) Inventors: Chi Taou Tsai, Chandler, AZ (US); Thomas E. Zirkle, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/930,660

(22) Filed: Aug. 31, 2004

(65) Prior Publication Data

US 2006/0044188 A1  Mar. 2, 2006

(51) Int. Cl.
*H01Q 1/38* (2006.01)
(52) U.S. Cl. .............................. 343/700 MS; 343/770
(58) Field of Classification Search ......... 343/700 MS, 343/767, 770, 771, 846
See application file for complete search history.

(56) References Cited

U.S. PATENT DOCUMENTS

| | | | |
|---|---|---|---|
| 5,608,414 A * | 3/1997 | Amore | 343/700 MS |
| 5,914,693 A | 6/1999 | Takei et al. | |
| 5,966,101 A | 10/1999 | Haub et al. | |
| 5,977,924 A | 11/1999 | Takei et al. | |
| 6,028,562 A * | 2/2000 | Guler et al. | 343/771 |
| 6,172,651 B1 | 1/2001 | Du | |
| 6,195,051 B1 | 2/2001 | McCoy et al. | |
| 6,239,762 B1 | 5/2001 | Lier | |
| 6,359,590 B1 | 3/2002 | Takenoshita | |
| 6,727,855 B1 | 4/2004 | Nalbandian | |
| 2001/0015705 A1 | 8/2001 | Scordilis | |
| 2002/0070901 A1 | 6/2002 | Sakota et al. | |

FOREIGN PATENT DOCUMENTS

| | | |
|---|---|---|
| EP | 798 807 A2 | 10/1997 |
| EP | 1 304 766 A1 | 4/2003 |

OTHER PUBLICATIONS

Kamgaing, Telesphor, "High-Impedance Electromagnetic Surfaces for Mitigation of Switching Noise in High-Speed Circuits," Dissertation submitted to the Faculty of the Graduate School of the Univeristy of Maryland, 2003.

Rogier, H., et al. "Design of an On-Package Slot Antenna for Bluetooth Applications," IEEE Conference on Electrical Performance of Electronic Packaging, Oct. 23-25, 2000. pp. 292-295.

Yue, C. Patrick, et al., "On-Chip Spiral Inductors with Patterned Ground Shields for Si-Based RF IC's," IEEE Journal of Solid-State Circuits, vol. 33, No. 5, May 1998.

* cited by examiner

*Primary Examiner*—Shih-Chao Chen

(57) ABSTRACT

An exemplary slot antenna having an antenna cavity that extends over multiple layers is provided. The slot antenna includes a reference conductive layer, a radiating conductive layer having at least one slot opening, one or more intermediate conductive layers disposed between the reference conductive layer and the radiating conductive layer, and two or more dielectric layers. The two or more dielectric layers include at least a first dielectric layer disposed between the reference conductive layer and the one or more intermediate conductive layers and a second dielectric layer disposed between the one or more intermediate conductive layers and the radiating conductive layer. Each of the one or more intermediate conductive layers includes at least one opening substantially devoid of conductive material. Due to its reduced footprint in the x-y plane, the multilayer slot antenna may be embedded in an integrated circuit package for use in a wireless device. The multilayer slot antenna also exhibits dual resonant frequencies under certain circumstances.

24 Claims, 6 Drawing Sheets

MULTILAYER CAVITY SLOT ANTENNA

FIELD OF THE DISCLOSURE

The present disclosure relates generally to slot antennas and more particularly to embedded slot antennas in circuit packages.

BACKGROUND

Antennas, such as slot antennas and patch antennas, are employed in a wide variety of wireless devices, such as cell phones, pagers, wireless personal digital assistants, access points and other wireless local area network (WLAN) components, and the like. One common goal for the design of such wireless devices is to minimize the product dimensions. Another common goal is to incorporate some or all of the components into an integrated circuit (IC) package. However, due to their physical properties, conventional slot antennas inhibit the full achievement of these goals.

The resonant frequency (also referred to as the radiation frequency) of a traditional slot antenna is inversely proportional to the length of its slot. However, when slot antennas are employed in small structures, it has been observed that the resonant frequency of such slot antennas instead become inversely proportional to the area of the resonant cavity of the slot antenna. Thus, to achieve a lower resonant frequency the dimensions of the slot antenna must be increased in the x-y plane of the slot antenna. Due to the relatively low wireless frequencies employed in common wireless communication standards, this inversely proportional relationship between frequency and cavity area often prevents slot antennas from being incorporated into devices, or even if incorporated, from being integrated into an IC package. To illustrate, a conventional slot antenna generally is required to have a resonant cavity with an area that is at around 900 $mm^2$ (1.395 $in^2$) to have a resonant frequency in the 2.4 gigahertz (GHz) frequency range, a size that is prohibitive in many applications.

Accordingly, an improved slot antenna would be advantageous.

BRIEF DESCRIPTION OF THE DRAWINGS

The purpose and advantages of the present disclosure will be apparent to those of ordinary skill in the art from the following detailed description in conjunction with the appended drawings in which like reference characters are used to indicate like elements, and in which.

DETAILED DESCRIPTION OF THE DISCLOSURE

The following description is intended to convey a thorough understanding of the present disclosure by providing a number of specific embodiments and details involving multilayer slot antennas and integrated circuit packages having such antennas embedded. It is understood, however, that the present disclosure is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

FIGS. 1–12 illustrate various exemplary multilayer slot antennas, exemplary integrated circuit packages implementing such multilayer slot antennas, and exemplary methods for producing such slot antennas and integrated circuit packages. In one embodiment, the slot antenna includes a reference conductive layer, a radiating conductive layer including at least one slot opening, one or more intermediate conductive layers disposed between the reference conductive layer and the radiating conductive layer, and two or more dielectric layers, the two or more dielectric layers including at least a first dielectric layer disposed between the reference conductive layer and the one or more intermediate conductive layers and a second dielectric layer disposed between the one or more intermediate conductive layers and the radiating conductive layer. Each of the one or more intermediate conductive layers includes at least one opening substantially devoid of conductive material. In another embodiment, the slot antenna includes a first conductive layer, a second conductive layer having at least one slot opening, a third conductive layer disposed between the first and second conductive layers, a first dielectric layer adjacent to a first side of the third conductive layer and a second dielectric layer adjacent to a second side of the third conductive layer. The third conductive layer includes an opening substantially absent of conductive material. Further, a method is discloses, wherein the method includes forming a reference conductive layer, forming a radiating conductive layer having at least one slot opening, and forming a resonant cavity, the resonant cavity including a plurality of layers, each layer including a conductive layer with at least one opening substantially void of conductive material and a dielectric layer adjacent to the conductive layer.

Figure 1:
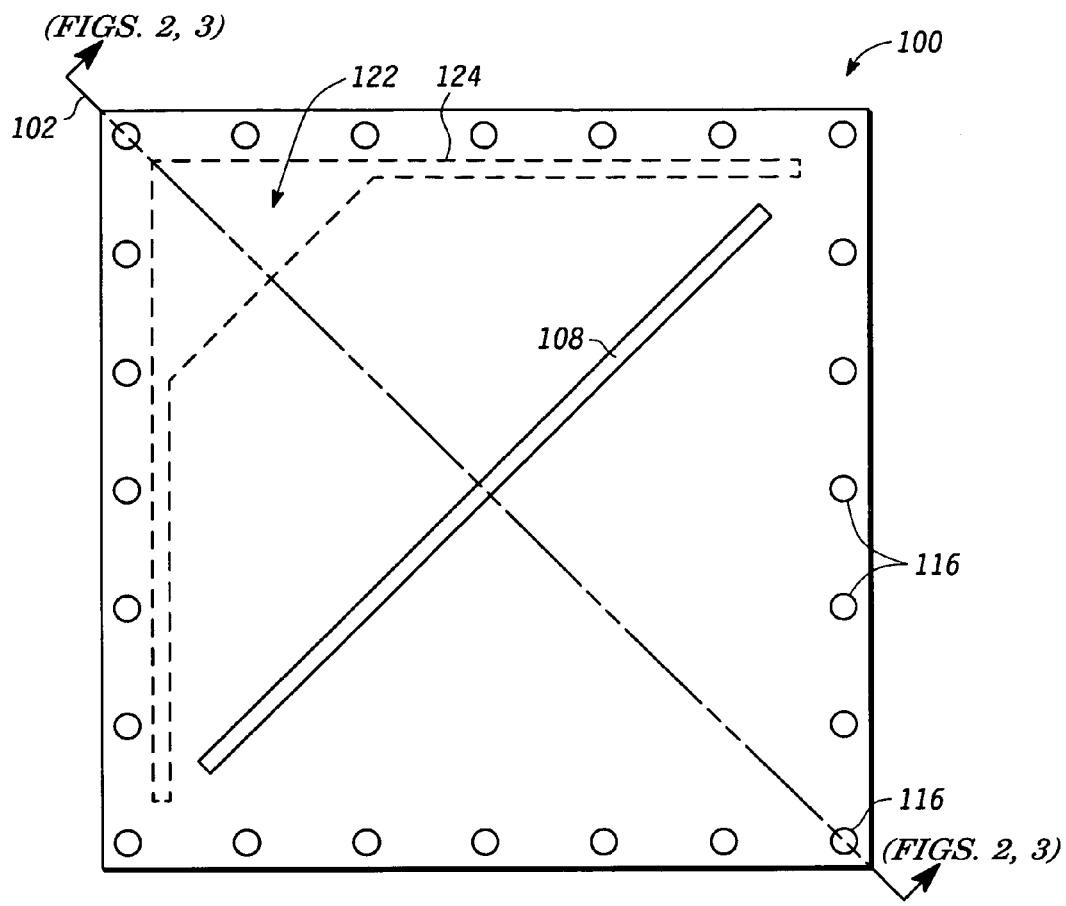
FIG. 1 is a block diagram of a top view of an exemplary multilayer slot antenna in accordance with at least one embodiment of the present disclosure.
Figure 2:
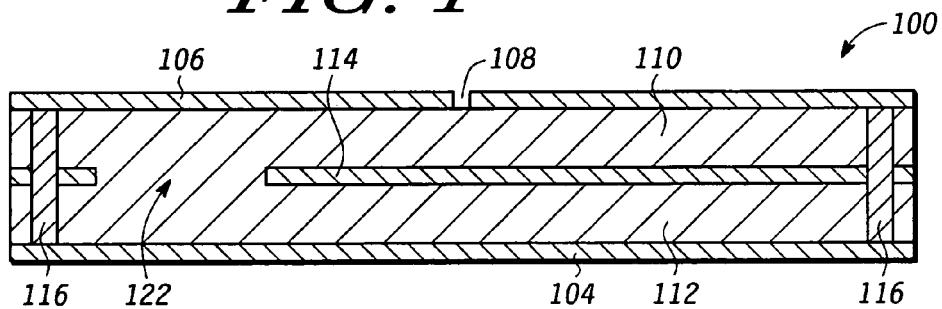
FIGS. 2 and 3 are block diagrams of alternate exemplary cross-sections of the multilayer slot antenna of FIG. 1 in accordance with at least one embodiment of the present disclosure.
Figure 3:
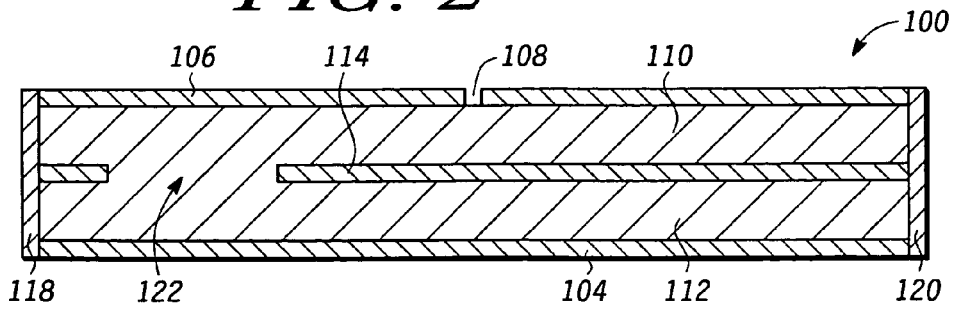

Referring now to FIGS. 1–3, a top view (FIG. 1) of an exemplary multilayer slot antenna 100 and alternate cross-section views of the antenna 100 (FIGS. 2 and 3) along line 102 are illustrated in accordance with at least one embodiment of the present invention. The slot antenna 100 includes a reference conductive layer (e.g., a ground plane or shield)

104 and a radiating conductive layer 106 having one or more slots 108 formed therein. The one or more slots 108 may be positioned or arranged in any of a variety of locations or arrangements in the radiating conductive layer 106. Moreover, the one or more slots 108 may have any of a variety of shapes and dimensions.

Disposed between the reference conductive layer 104 and the radiating conductive layer 106 are at least two layers of dielectric material (e.g., dielectric layers 110 and 112) separated at least in part by one or more respective intermediate layers of conductive material (e.g., intermediate conductive layer 114). The slot antenna 100 further includes one or more conductive structures to electrically couple the radiating conductive layer 106, the one or more intermediate conductive layers 114 and the reference conductive layer 104. As FIGS. 1 and 2 illustrate, the conductive structures may include one or more vias 116 extending from the radiating conductive layer 106 to the reference conductive layer 104. As an alternate example illustrated by FIG. 3, the conductive structures may include one or more conductive sidewalls (e.g., sidewalls 118 and 120) disposed along at least a portion of one or more sides of the layers 104, 106, 110 112 and 114 such that the layers 104, 106 and 114 are electrically coupled on one or more sides. Although two examples of conductive structures have been illustrated, it will be appreciated that other suitable conductive structures, such as bond wires, or combinations of conductive structures may be utilized.

In at least one embodiment, the intermediate conductive layer 114 is only partially coextensive with the radiating conductive layer 106 so as to form at least one opening 122 in the intermediate conductive layer 114 that is substantially devoid of conductive material. The outline of an exemplary opening 122 in the intermediate conductive layer 114 is illustrated using dotted line 124 in FIG. 1. The opening 122 may have any of a variety of dimensions and shapes as appropriate. As FIGS. 1–3 illustrate, the intermediate conductive layer 114 is partially coextensive with the radiating conductive layer 106 in that, rather than entirely shielding the radiating conductive layer 106 from the reference conductive layer 104, the intermediate conductive layer 114 includes the one or more openings 122 that permit electromagnetic (EM) energy to pass from the reference conductive layer 104 to the radiating conductive layer 106, and vice versa.

The layered structure of the slot antenna 100, along with the use of one or more openings 122 in the intermediate conductive layers 114, results in a resonant cavity that extends over a plurality of cavity layers, where the boundaries of the cavity layers, and therefore the resonant cavity, may be at least partially defined by the reference conductive layer 104, the radiating conductive layer 106, the one or more intermediate conductive layers 114 and the conductive structures electrically coupling the layers 104, 106 and 114 (e.g., the vias 116 or the sidewalls 118 and 120). Thus, it will be appreciated that the resonant cavity of the slot antenna 100 is "folded" over multiple layers, thereby allowing the slot antenna 100 to retain the same equivalent cavity area in the x-y plane as conventional slot antennas having the same resonant frequency while having reduced dimensions in the x-y plane (i.e., a smaller footprint) compared to the conventional slot antennas. As the slot antenna 100 has a smaller footprint than conventional slot antennas with the same resonant frequency, the slot antenna 100 may be more easily implemented in a small wireless device or more easily integrated into an integrated circuit package compared to the conventional slot antennas.

Figure 4:
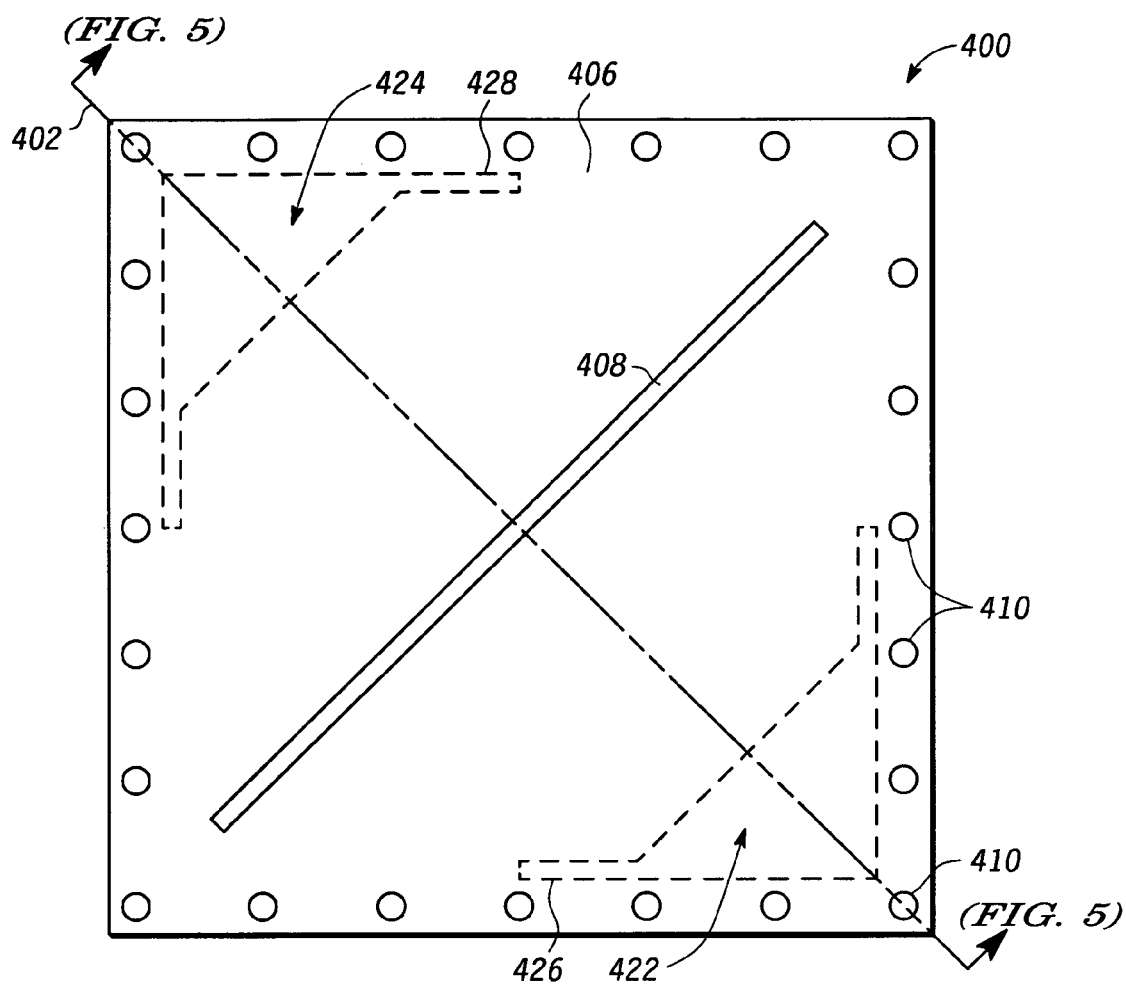
FIG. 4 is a block diagram of a top view of another exemplary multilayer slot antenna in accordance with at least one embodiment of the present disclosure.
Figure 5:
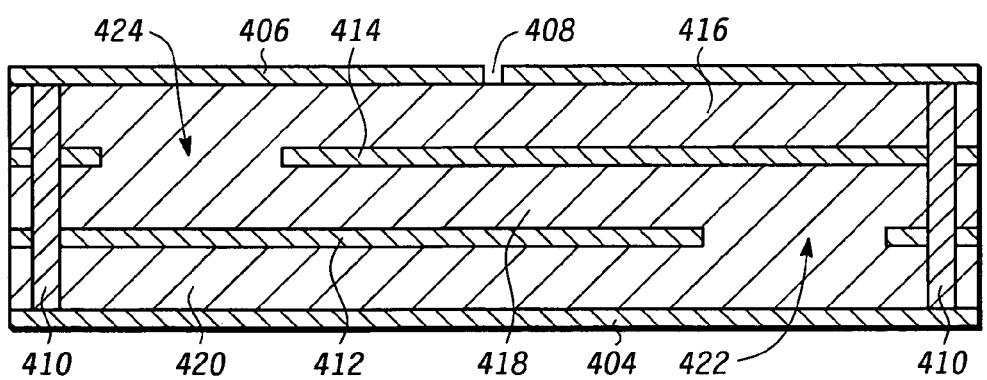
FIG. 5 is a block diagram of a cross-section view of the exemplary multilayer slot antenna of FIG. 4 in accordance with at least one embodiment of the present disclosure.

Referring now to FIGS. 4 and 5, a top view (FIG. 4) and a cross-section view (FIG. 5) of another exemplary multilayer slot antenna 400 along line 402 are illustrated in accordance with at least one embodiment of the present disclosure. Although the slot antenna 100 is illustrated as a slot antenna having two cavity layers, more than two cavity layers may be implemented in a slot antenna in accordance with the present disclosure. As similarly discussed above with reference to the slot antenna 100, the slot antenna 400 includes a reference conductive layer 404, a radiating conductive layer 406 having one or more slots 408, and one or more conductive structures (e.g., vias 410) to electrically couple radiating conductive layer 406 to the reference conductive layer 404. In the illustrated example of FIG. 4, the slot antenna 400 further includes two intermediate conductive layers 412 and 414. The intermediate conductive layers 412 and 414 are separated from each other, the radiating conductive layer 406 and the reference conductive layer 404 by three respective dielectric layers 416, 418 and 420.

As discussed above with respect to the intermediate conductive layer 114 of FIG. 1, the intermediate conductive layers 412 and 414, in one embodiment, are partially coextensive with the radiating conductive layer 406 in that they each have one or more openings (e.g., openings 422 and 424) that are substantially devoid of conductive material. Exemplary perimeters of the openings 422 and 424 are illustrated in FIG. 4 using dotted lines 426 and 428, respectively. One purpose of the openings 422 and 424 in the intermediate layers 412 and 414 is to allow the transmission of EM energy from the dielectric layer 420 to the radiating conductive layer dielectric layer 416, and vice versa, via the openings 422 and 424, where the EM energy is guided by the intermediate conductive layers 412 and 414. Accordingly, the openings 422 and 424 preferably are located in different respective positions at the intermediate conductive layers 412 and 414 such that a direct path for EM energy from the reference conductive layer 404 to the radiating conductive layer 406, and vice versa, is not provided via the openings 422 and 424. In other words, the one or more openings in a particular intermediate conductive layer preferably are positioned such that there is little or no overlap between the one or more openings and the one or more openings in an adjacent intermediate conductive layer.

Moreover, to maximize the effective cavity area of the slot antenna 400, the openings 422 and 424 preferably are positioned at their respective intermediate conductive layers 412 and 414 so as to maximize the distance between the openings (thereby maximizing the effective cavity area of the cavity portion between the intermediate conductive layers 412 and 414). As exemplarily illustrated in FIGS. 4 and 5, this maximum distance may be obtained by positioning the opening 422 in one corner of the slot antenna 400 and the other opening 424 in the opposite corner of the slot antenna 400. However, in certain circumstances, it may be appropriate to position the openings 422 and 424 closer together (e.g., in adjacent corners). Furthermore, the effective distance between the openings 422 and 424, and consequently, the effective cavity area, also may be increased by using openings of certain shapes and orientations with respect to each other.

Figure 6:
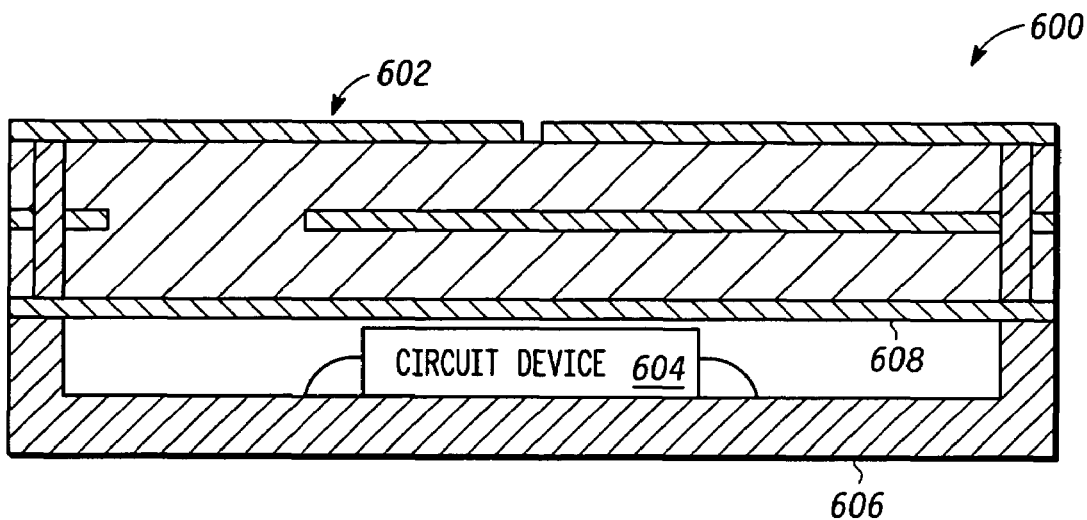
FIGS. 6 and 7 are block diagrams of cross-section views of alternate exemplary integrated circuit packages having a multilayer slot antenna in accordance with at least one embodiment of the present disclosure.
Figure 7:
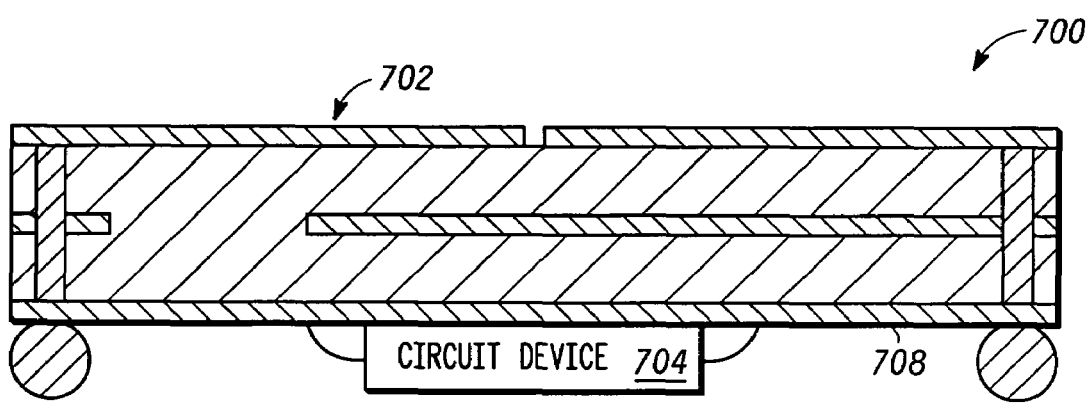

Referring now to FIGS. 6 and 7, exemplary integrated circuit (IC) packages having integrated multilayer slot antennas are illustrated in accordance with at least one embodiment of the present invention. As noted above, the comparatively small footprint achievable by forming the resonant cavity of a slot antenna over multiple layers allows such slot antennas to be more easily integrated into IC packages. For example, FIG. 6 illustrates an exemplary IC package 600 including a multilayer slot antenna 602, such as the slot antenna 100 of FIGS. 1–3 or the slot antenna 400 of FIGS. 4 and 5. The IC package 600 further includes one or more circuit devices 604 having one or more inputs or outputs operably coupled (e.g., via bond wires) to a circuit substrate 606. The circuit substrate 606, in turn, may comprise one or more dielectric layers and/or redistribution layers for routing signaling and power signals between the one or more circuit devices 604, the slot antenna 602, and other components of the package 600. The circuit substrate 606, in turn, has one or more inputs operably coupled (e.g., by one or more vias) to the reference conductive layer 608 of the slot antenna 602. FIG. 7 similarly illustrates an IC package 700 including a multilayer slot antenna 702, such as the slot antenna 100 or slot antenna 400 of FIGS. 1–5, a circuit substrate comprising one or more dielectric layers and redistributions layers, and one or more circuit devices 704 having one or more inputs or outputs operably coupled to the reference conductive layer 708 of the slot antenna 702 via the circuit substrate (e.g., by one or more vias).

The IC packages 600 or 700, in turn, may be coupled to other IC packages or other circuit devices of a wireless device. For example, the IC packages 600 or 700 may be implemented in a wireless system in a package (SIP) or a system on a chip (SOC) that, in turn, may be implemented in any of a variety of devices that may make use of a slot antenna.

Figure 10:
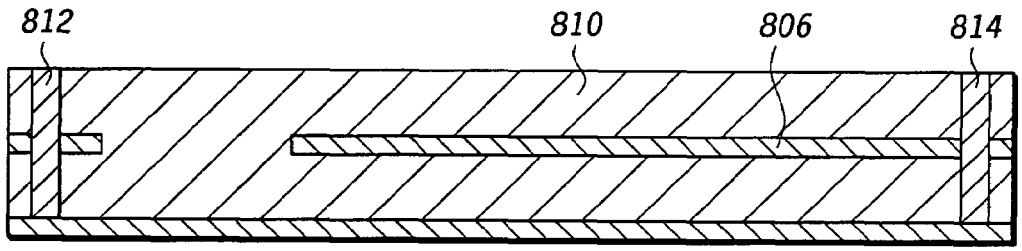
Figure 11:
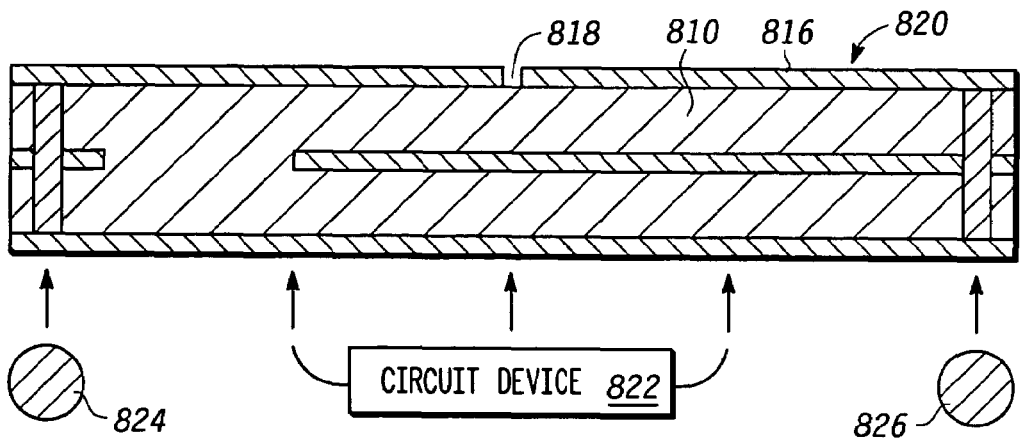
Figure 12:
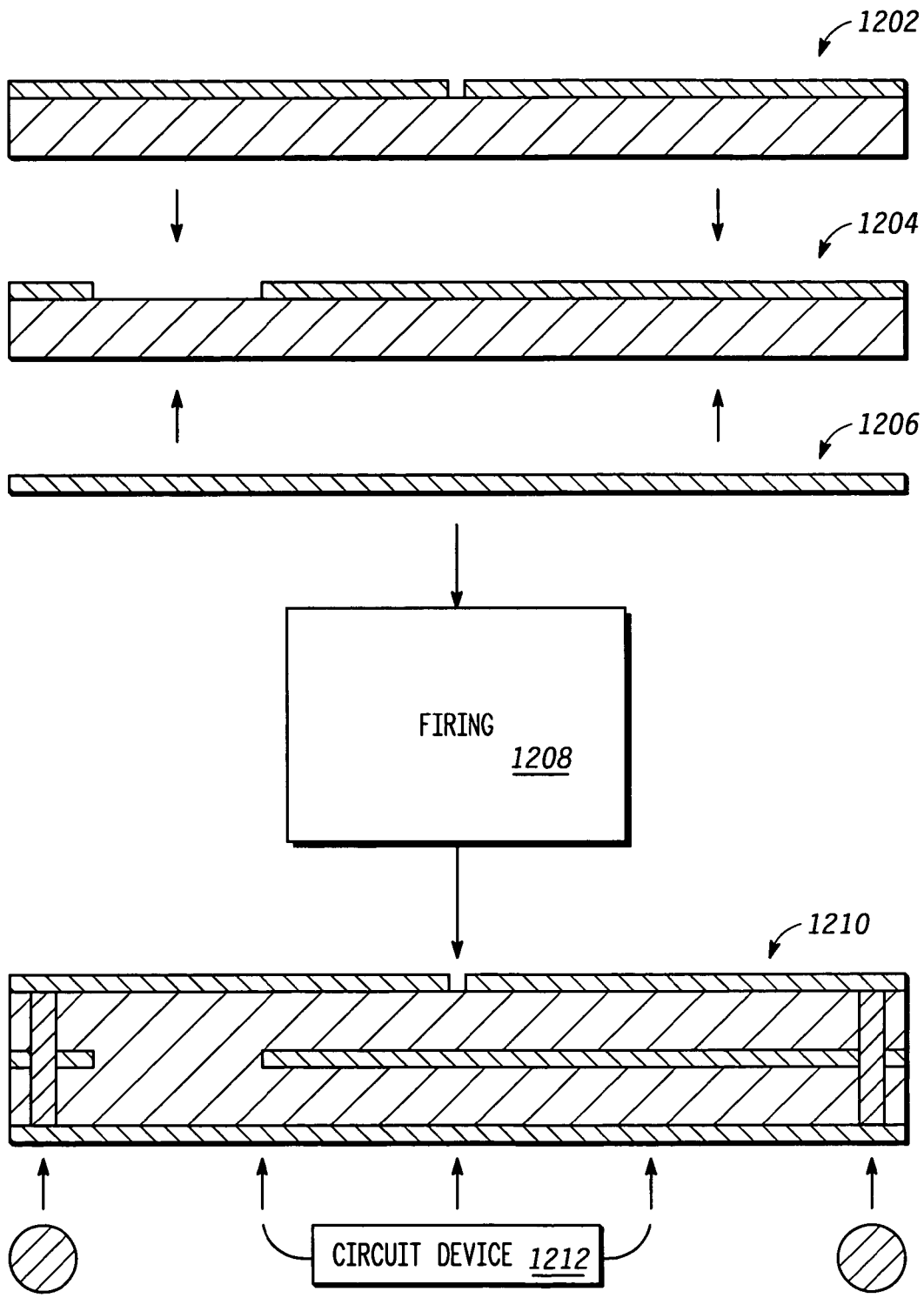
FIG. 12 is a block diagram illustrating another exemplary method for manufacturing an integrated circuit package including a multilayer slot antenna in accordance with at least one embodiment of the present disclosure.

Referring now to FIGS. 8–12, various exemplary methods for manufacturing an IC package having a multilayer slot antenna are illustrated in accordance with at least one embodiment of the present invention. Although FIGS. 8–11 illustrate a manufacturing processes in the context of a multilayer organic device and FIG. 12 illustrates a manufacturing process in the context of a co-fired ceramic device, other circuit manufacturing processes may be implemented using the guidelines provided herein without departing from the spirit or the scope of the present disclosure.

Figure 8:
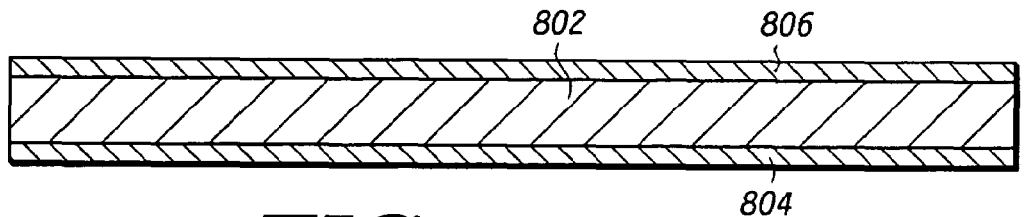
FIGS. 8–11 are block diagrams illustrating an exemplary method of manufacturing an integrated circuit package including a multilayer slot antenna in accordance with at least one embodiment of the present disclosure.

FIGS. 8–11 illustrate an exemplary method whereby a multilayer slot antenna is formed using organic multilayer fabrication techniques. To illustrate, layers of conductive material may be formed on a first side and a second side of a dielectric layer 802. The conductive material may be formed on opposing surfaces of the dielectric layer 802 using any of a variety of process, such as crystalline growth, screen printing, deposition, photo-imaging, and the like. Alternatively, one or both of the conductive layers may include a metal sheet (e.g., a copper, aluminum or gold foil) positioned on one or both surfaces of the dielectric layer 802. In the example of FIG. 8, the bottom conductive layer represents a reference conductive layer 804 of a slot antenna and the top conductive represents an intermediate conductive layer 806 of the slot antenna.

Figure 9:
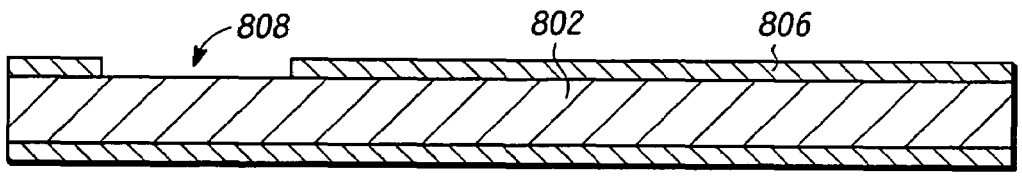

In FIG. 9, an opening 808 (e.g., opening 122 of FIG. 1) is formed in the intermediate conductive layer 806 using, for example, a photo-etching process. Alternatively, the opening 808 may be formed in the intermediate conductive layer 806 during the formation of the intermediate conductive layer 806 on a surface of the dielectric layer 802. As noted above, the opening 808 preferably is substantially devoid of conductive material so as to not impede the transmission of EM energy.

In FIG. 10, a second dielectric layer 810 is formed or positioned on the exposed surface of the intermediate conductive layer 806. Additionally, one or more vias, such as vias 812 and 814, may be formed and filled or plated with a conductive material. Although FIGS. 8–11 illustrate an exemplary slot antenna having a resonant cavity formed over two cavity layers, a slot antenna having a resonant cavity formed over more than two cavity layers may be formed by repeating the processes illustrated in FIGS. 8–10.

In FIG. 11, conductive material is formed or positioned on the exposed surface of the dielectric layer 810 to form a radiating conductive layer 816 and or more slots 818 may be formed in the radiating conductive layer 816 before, during or after the formation/positioning of the radiating conductive layer 816. The resulting slot antenna 820 may be integrated into an IC package by, for example, electrically coupling one or more circuit devices 822 and/or package leads (e.g., balls 824 and 826) to the slot antenna, via, for example, a circuit substrate 822 having one or more dielectric layers and/or one or more redistribution layers for routing signaling and power interconnects between the one or more circuit devices 822, package leads and the slot antenna 820. Furthermore, the slot antenna may be encapsulated in a dielectric material (not shown), such as plastic, ceramic or glass, to form a monolithic device.

Referring now to FIG. 12, an exemplary method for forming an IC package having a multilayer slot antenna using a co-fired ceramic process (e.g., a low-temperature co-fire ceramic, or LTCC, process) is illustrated. The various layers of a multilayer slot antenna, such as the slot antenna 100 of FIGS. 1 and 2, may be formed using, for example, ceramic cast tape sections 1202–1206 and the metallizations representing the intermediate conductive layers, the radiating conductive layer of the slot antenna, and the conductive structures that electrically couple the conductive layers (e.g., vias or conductive sidewalls) may be formed on the surfaces of the ceramic cast tape sections.

The ceramic cast tape sections 1202–1206 then may be stacked in the appropriate order and laminated to form a single substrate. The substrate then may be fired in a firing oven 1208 so as harden the material, resulting in a multilayer slot antenna 1210. The multilayer slot antenna 1210 then may be integrated into an IC package by electrically coupling one or more circuit devices 1212 to the slot antenna 1210, coupling package leads to the slot antenna 1210 or the one or more circuit devices 1212, encapsulating the resulting device in a dielectric material, and the like.

Figure 13:
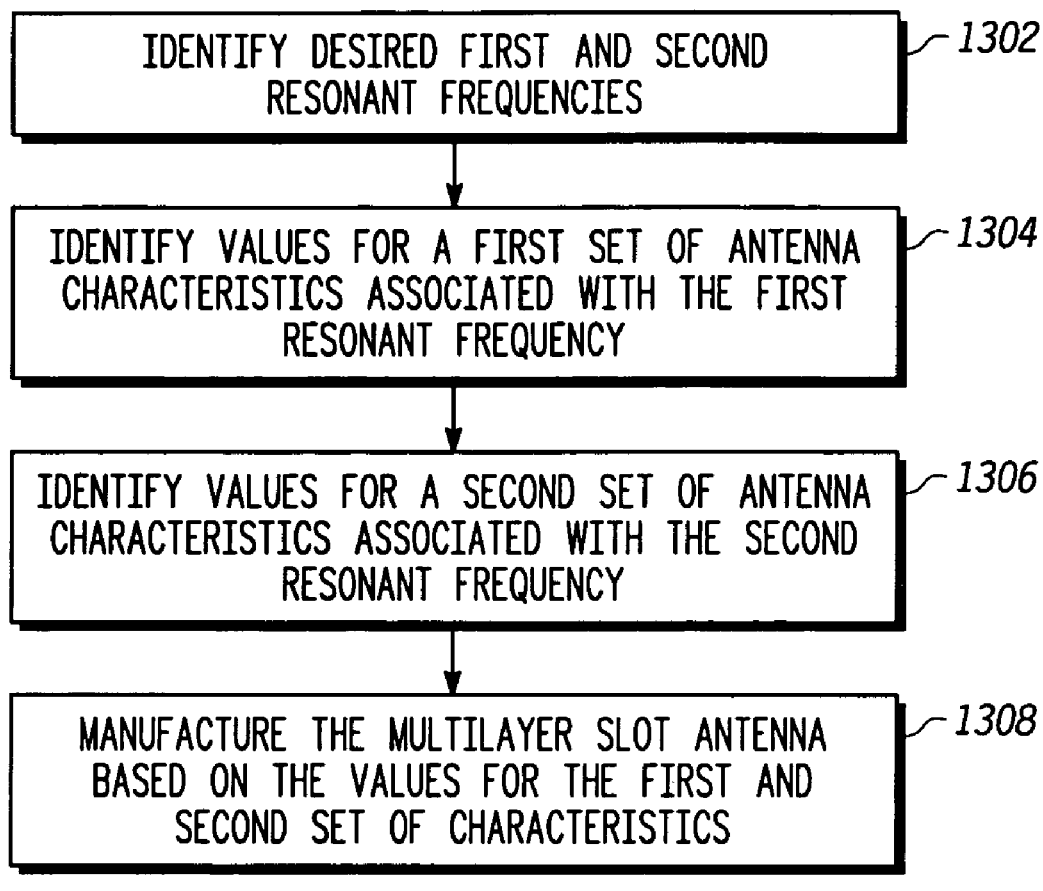
FIG. 13 is a flow diagram illustrating an exemplary method for manufacturing a multilayer slot antenna having a first desired resonant frequency and a second desired resonant frequency in accordance with at least one embodiment of the present disclosure.

Referring now to FIG. 13, an exemplary method for identifying characteristics of a multilayer slot antenna so as to achieve multiple resonant frequencies is illustrated in accordance with at least one embodiment of the present invention. Due to various physical properties, the multilayer slot antennas disclosed above are capable or resonating at two or more distinct frequencies. Accordingly, a multilayer slot antenna may be designed to operate at multiple different frequencies. For example, a multilayer slot antenna may be designed to be compliant with multiple standards having different frequency bandwidths. To illustrate, the multilayer slot antenna may be designed and manufactured to be compliant with one or more of the Bluetooth standard, the IEEE 802.11b standard or the IEEE 802.15.4 standard (all of which specify a 2.4 GHz center frequency), the IEEE 802.11a standard (which specifies a 5.8 GHz center frequency) or the global positioning system (GPS) standard (which specifies a 1.57542 GHz center frequency). Method 1300 illustrates an exemplary method for identifying characteristics of the slot antenna that result in two resonating frequencies of the multilayer slot antenna being at or near the desired center frequencies (e.g., 1.57542 GHz, 2.4 GHz or 5.8 GHz). Although the following exemplary method is described in the context of tuning or forming a slot antenna to resonate at two widely-utilized frequencies for ease of illustration, a multilayer slot antenna may be formed or tuned, using the guidelines provided herein, to resonate at more than two desired frequencies without departing from the spirit or the scope of the present invention.

At step 1302, the desired resonant frequencies of the multilayer slot antenna to be formed are identified. To illustrate, if the slot antenna is to be implemented in, for example, a wireless device compliant with both IEEE 802.11a and IEEE 802.11b, desirable resonant frequencies for the slot antenna would be 5.8 GHz and 2.4 GHz.

At step 1304, values for a first set of one or more characteristics of the multilayer slot antenna that cause the slot antenna to resonate at the first desired frequency are identified. At step 1306, values for a second set of one or more characteristics of the multilayer slot antenna that cause the slot antenna to resonate at the second desired frequency are identified. The characteristics may include, but are not limited to: the number of cavity layers; the material including the dielectric layers or the conductive layers of the slot antenna; the dimensions (e.g., width, length and thickness) of the dielectric layers or conductive layers; the number of openings in the intermediate conductive layers; the dimensions of the openings in the intermediate conductive layers; the shape of the openings in the conductive layers; the positions of the openings in the intermediate conductive layers; the number of slots in the radiating conductive layer; the dimensions of the one or more slots; the positions of the one or more slots; and the like.

Values of slot antenna characteristics associated with a particular resonating frequency may be identified using any of a variety of techniques. For example, the values may be identified through empirical analysis of other multilayer slot antennas, through modeling or simulation of the slot antenna, and the like. It will also be appreciated that the characteristics of the slot antenna identified as having an effect on the first resonant frequency of the slot antenna also may have an effect on the second resonant frequency. Accordingly, the identification of the values of the first and second sets may be performed using an iterative approach. After the values for certain characteristics associated with the first and second resonant frequencies are identified, a multilayer slot antenna may be formed or manufactured based on the identified values at step 1308.

Other embodiments, uses, and advantages of the invention will be apparent to those skilled in the art from consideration of the specification and practice of the invention disclosed herein. The specification and drawings should be considered exemplary only, and the scope of the invention is accordingly intended to be limited only by the following claims and equivalents thereof.

What is claimed is:

1. An antenna comprising:
    a reference conductive layer to emit electromagnetic energy in response to an electrical signal received at the reference conductive layer;
    a radiating conductive layer comprising at least one slot opening;
    one or more intermediate conductive layers disposed between the reference conductive layer and the radiating conductive layer; and
    two or more dielectric layers, the two or more dielectric layers comprising at least a first dielectric layer disposed between the reference conductive layer and the one or more intermediate conductive layers and a second dielectric layer disposed between the one or more intermediate conductive layers and the radiating conductive layer;
    wherein each of the one or more intermediate conductive layers comprise at least one opening substantially devoid of conductive material.

2. The antenna of claim 1, wherein:
    the one or more intermediate conductive layers comprise a first intermediate conductive layer and a second intermediate conductive layer; and
    the two or more dielectric layers further comprise a third dielectric layer, the third dielectric layer disposed between the first and second intermediate conductive layers.

3. The antenna of claim 1, further comprising one or more conductive structures electrically coupling the reference conductive layer, the one or more intermediary conductive layers and the radiating conductive layer.

4. The antenna of claim 3, wherein the one or more conductive structures comprise at least one via coupling the reference conductive layer, the one or more intermediary conductive layers and the radiating conductive layer.

5. The antenna of claim 1, wherein the antenna is embedded in an integrated circuit package.

6. The antenna of claim 5, wherein the antenna is operably coupled to at least one circuit device of the integrated circuit package.

7. The antenna of claim 1, wherein the antenna is compliant with at least one of: a Bluetooth standard; an IEEE 802.11 standard; an IEEE 802.15.4 standard; or a GPS standard.

8. The antenna of claim 1, wherein the antenna has a first resonating frequency and a second resonating frequency.

9. The antenna of claim 8, wherein at least one of the first and second resonating frequencies comprises approximately a 2.4 GHz frequency or a 5.8 GHz frequency.

10. An antenna comprising:
    a first conductive layer;
    a second conductive layer having at least one slot opening;
    a third conductive layer disposed between the first and second conductive layers, wherein the third conductive layer comprises one or more openings substantially absent of conductive material;
    a first dielectric layer adjacent to a first side of the third conductive layer; and
    a second dielectric layer adjacent to a second side of the third conductive layer;
    a fourth conductive layer disposed between the first conductive layer and the second conductive layer, the fourth conductive layer comprising one or more openings substantially absent of conductive material; and
    a third dielectric layer adjacent to a first side of the fourth conductive layer; and
    wherein an opening in the fourth conductive layer is in a first position of the fourth conductive layer and an opening in the third conductive layer is in a second position of the third conductive layer, where the first position is substantially different from the second position.

11. The antenna of claim 10, wherein the antenna is compliant with at least one of: a Bluetooth standard; an IEEE 802.11 standard; an IEEE 802.15.4 standard; or a GPS standard.

12. The antenna of claim 10, further comprising one or more conductive structures coupling the first, second and third conductive layers.

13. The antenna of claim 10, wherein the one or more conductive structures comprise at least one via coupling the first, second and third conductive layers.

14. The antenna of claim 10, wherein the antenna has a first resonating frequency and a second resonating frequency.

15. The antenna of claim 14, wherein at least one of the first and second resonating frequencies comprises approximately a 2.4 GHz frequency or a 5.8 GHz frequency.

16. An antenna comprising:
a first conductive layer;
a second conductive layer having at least one slot opening;
a third conductive layer disposed between the first and second conductive layers;
a first dielectric layer adjacent to a first side of the third conductive layer; and
a second dielectric layer adjacent to a second side of the third conductive layer;
wherein the third conductive layer comprises one or more openings substantially absent of conductive material; and
wherein the antenna is embedded in an integrated circuit package.

17. The antenna of claim 16, wherein the antenna is operably coupled to at least one circuit device of the integrated circuit package.

18. A method comprising:
forming a reference conductive layer;
forming a radiating conductive layer having at least one slot opening; and
forming a resonant cavity, the resonant cavity comprising a plurality of layers, each layer comprising a conductive metal layer with at least one opening substantially devoid of conductive material and a dielectric layer adjacent to the conductive metal layer.

19. The method of claim 18, further comprising forming one or more conductive structures to electrically couple the reference conductive layer, the radiating conductive layer and the conductive metal layers of the resonant cavity.

20. The method of claim 19, wherein the one or more conductive structures comprise at least one via.

21. The method of claim 18, wherein the plurality of layers are formed using a low temperature ceramic co-fired process.

22. The method of claim 18, further comprising:
identifying a value for each of one or more characteristics of one or more of the radiating conductive layer or the resonant cavity that is associated with a first resonant frequency;
identifying a value for each of one or more characteristics of one or more of the radiating conductive layer or the resonant cavity that is associated with a second resonant frequency; and
forming at least one of the radiating conductive layer and the resonant cavity based on the values for the one or more characteristics.

23. The method of claim 22, wherein the one or more characteristics include one or more of: a slot opening dimension, a slot opening shape, a slot opening position; a thickness of one or more of the plurality of layers; respective dimensions of the openings of one or more of the conductive metal layers; respective positions of the openings of one or more of the conductive metal layers; or respective shapes of the openings of one or more of the conductive metal layers.

24. The method of claim 18, wherein the conductive metal layer of a first layer of the plurality of layers of the resonant cavity comprises one of the reference conductive layer or the radiating conductive layer.

* * * * *